United States Patent [19]

Ito et al.

[11] 4,309,652
[45] Jan. 5, 1982

[54] CURRENT TRANSFORMING CIRCUITS

[75] Inventors: Teruhiko Ito, Yokohama; Haruo Takahashi, Kawasaki, both of Japan

[73] Assignee: Tokyo Shibaura Denki Kabushiki Kaisha, Japan

[21] Appl. No.: 128,300

[22] Filed: Mar. 7, 1980

[30] Foreign Application Priority Data

Mar. 15, 1979 [JP] Japan .................................. 54-30463
Oct. 8, 1979 [JP] Japan ................................ 54-129750

[51] Int. Cl.³ .......................................... H01F 40/06
[52] U.S. Cl. .................................... 323/357; 324/127
[58] Field of Search ................... 323/6, 44 R, 48, 60, 323/61, 109, 112, 120, 121, 355, 356, 357, 358, 361, 364; 324/74, 123 C, 127

[56] References Cited

U.S. PATENT DOCUMENTS

| | | | |
|---|---|---|---|
| 3,363,169 | 1/1968 | Nicoletti | 323/44 R |
| 3,848,178 | 11/1974 | Marks | 323/6 |
| 3,881,149 | 4/1975 | Kiko | 323/6 |
| 3,916,310 | 10/1975 | Stark et al. | 323/48 X |

FOREIGN PATENT DOCUMENTS 4956122 5/1974 Japan .

OTHER PUBLICATIONS

Keikiyo Henseiki, Chap. 2, Sec. 4, "A Feedback Type Current Transformer"; Mihog, Ikeda, 1951 (Denki shoin).

Primary Examiner—William M. Shoop
Assistant Examiner—Peter S. Wong
Attorney, Agent, or Firm—Finnegan, Henderson, Farabow, Garrett & Dunner

[57] ABSTRACT

Current transforming apparatus comprising a current transformer and means for developing a current substantially expressed by $a \cdot I_2$, wherein $I_2$ denotes the secondary current of the current transformer. Impedance means is connected in series to a load of the current transformer and has an impedance $(Z_2 + Z_L)/(a-1)$, wherein $Z_2$ is the secondary leakage impedance of the current transformer and $Z_L$ is an impedance of the load. A current-voltage converter may be employed as the load of the current transformer.

22 Claims, 9 Drawing Figures

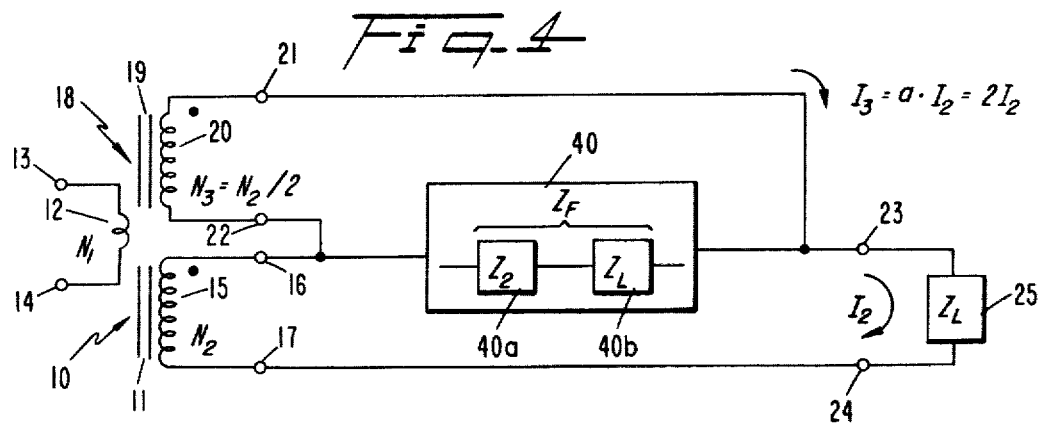
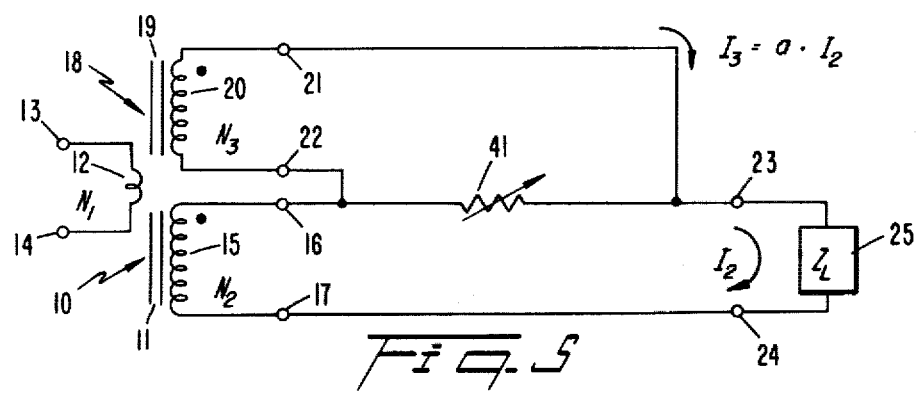
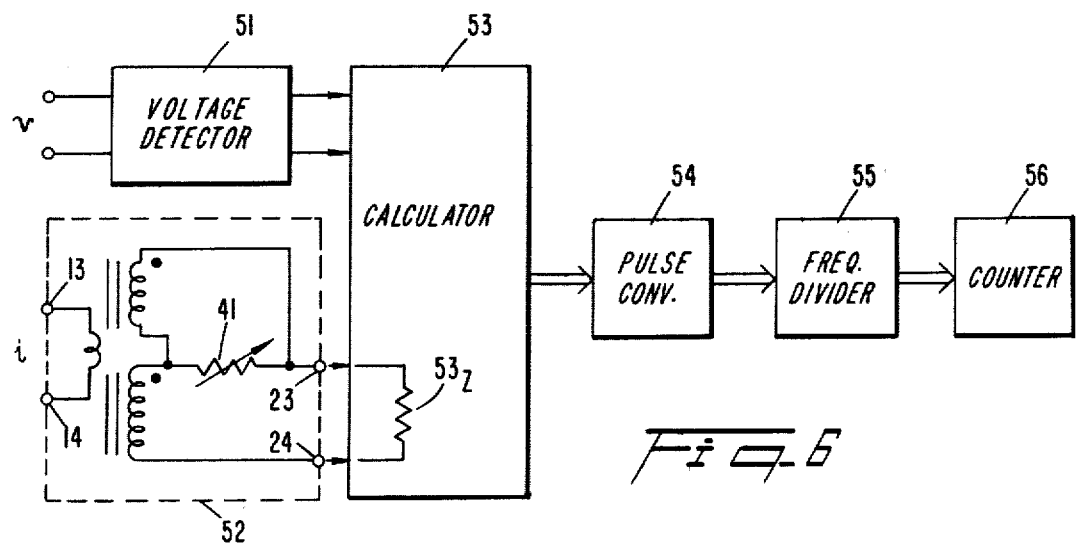

CURRENT TRANSFORMING CIRCUITS

BACKGROUND OF THE INVENTION

This invention relates to current transforming circuits having error-compensation devices.

Exciting currents are, as is well-known in the art, causes of error or inaccuracy in current transformers which is expressed by a combination of a ratio error and a phase angle error. For this reason, many attempts to reduce exciting currents have been made.

One such attempt, for example, is as follows. An auxiliary current transformer sharing a primary winding with a main current transformer is provided to develop a current expressed by $a \cdot I_2$, wherein a is an arbitrary numeral larger than 1, and $I_2$ is the current in the secondary winding of the main current transformer. Provided between the output terminals of the secondary winding of the main current transformer is a series connection of a load impedance $Z_L$ (i.e. a load on the main current transformer) and a feedback impedance $Z_{FO}$ expressed by:

$$Z_{FO} = (Z_L/a - 1)$$

A secondary winding of the auxiliary current transformer is connected to a feedback resistor such that a current expressed by $I_2 - a \cdot I_2$ flows therethrough.

Now, terminal voltages $e_2$ appearing across the secondary winding of the main current transformer will be:

$$e_2 = Z_{FO}(I_2 - a \cdot I_2) + Z_L \cdot I_2$$

$$= \frac{Z_L}{a-1} \cdot (I_2 - a \cdot I_2) + Z_L \cdot I_2$$

$$= \frac{Z_L}{a-1} \cdot (1 - a) \cdot I_2 + Z_L \cdot I_2$$

$$= 0$$

This means that the component of exciting current for generating the voltage appearing on the output terminals of the secondary winding of the main current transformer reduces to be zero, because such terminal voltage $e_2$ is zero as shown in the above equation. It is known that the existence of exciting current is necessary to generate secondary induced voltage.

In another attempt to render the current transformer error-free, current-voltage converters having substantially zero load input impedance are employed as loads for the current transformer. Such current-voltage converters are, for example, disclosed in pages 232–233 of "Operational Amplifiers Design and Applications" by J. G. Graeme and G. E. Tobby, published by McGraw-Hill.

In this latter attempt, the voltage across the output terminals of the secondary winding of the current transformer is also zero due to substantial short circuiting of such terminals, because the current-voltage converter has substantial zero input impedance.

In these prior art approaches, however, some error still remains. Current transforming circuits with accuracy acceptable for use in electronic watt-hour metering systems, has not been obtained.

SUMMARY OF THE INVENTION

Accordingly, it is an object of this invention to provide current transforming circuits of relatively high accuracy.

According to one feature of this invention, a current transforming circuit comprises: primary winding means; a secondary winding coupled magnetically to the primary winding means to form a current transformer; means for developing a current substantially equal to $(a \cdot I_2)$, wherein a is an arbitrary number greater than 1 and $I_2$ is the current in the secondary winding; impedance means adapted to be connected to load means to form a series connection therewith across the secondary winding, this impedance means having an impedance of approximately $(Z_2 + Z_L)/(a-1)$, wherein $Z_2$ is the leakage impedance of the secondary winding and $Z_L$ is the impedance of the load means; and the current developing means being connected to the impedance means such that a current substantially equal to $(I_2 - a \cdot I_2)$ flows therethrough to substantially null voltages induced in the secondary windings due to exciting current present therein.

According to another aspect of the invention, a current transforming circuit comprises: primary winding means; a secondary winding coupled magnetically to the primary winding means to form a current transformer; impedance means; current-to-voltage converting means having substantially zero input impedance, the current-to-voltage converting means being connected to the impedance means to form a series connection therewith across the secondary winding for developing a voltage substantially proportional to the secondary current in the secondary winding; and current developing means connected to apply a current to the impedance means, in cooperation with the secondary current in the first secondary winding, flowing such that the total current through the impedance means functions to substantially null the voltages induced in the first secondary winding due to the leakage impedance thereof.

BRIEF DESCRIPTION OF THE DRAWINGS

Other objects and features of this invention will be fully understood from the following description in conjunction with the drawings in which:

FIG. 4 shows a circuit diagram of one typical example of the embodiment shown in FIG. 1;

FIG. 5 shows another embodiment according to this invention;

FIG. 6 shows a block diagram of an electronic watt hour metering device incorporating the embodiment shown in FIG. 5;

Throughout these figures, identical or similar parts are indicated by the same reference numerals.

DETAILED DESCRIPTION OF THE PREFERRED EMBODIMENTS

According to our analysis, error in using the prior art devices is mainly due to the neglect of the leakage impedance in the secondary winding of the current transformer. It should be understood that such secondary leakage impedance includes not only leakage reactance due to leakage flux, but also resistance and stray capacitance in the secondary winding.

Figure 1:
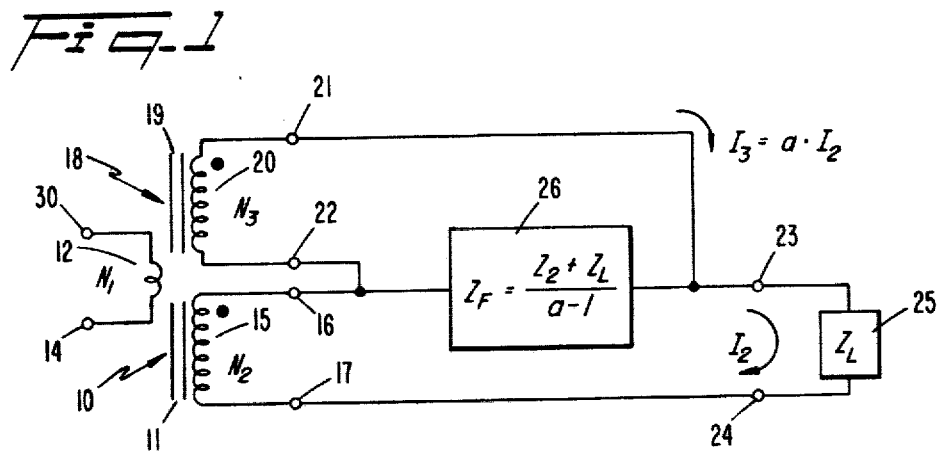
FIG. 1 shows a circuit diagram of one embodiment according to this invention.

Referring now to FIG. 1, a main current transformer, generally indicated at 10, has a magnetic core 11, a primary winding 12 of $N_1$ turns having terminals 13 and 14, and a secondary winding 15 of $N_2$ turns having terminals 16 and 17. An auxiliary current transformer, generally indicated at 18, shares the primary winding 12 with the main current transformer 10, and has a magnetic core 19 and a secondary winding 20 of $N_3$ turns wherein $N_3$ is smaller than $N_2$. This secondary winding 20 has terminals 21 and 22 which are wound to have the same polarity with respect to the primary winding 12 as terminals 16 and 17, respectively, of secondary winding 15 has to primary winding 12.

$I_2$ denotes a current flowing out from terminal 16 and $I_3$ denotes a current flowing out from terminal 21. The current $I_3$ is expressed by:

$$I_3 = a \cdot I_2$$

wherein $$a = N_2/N_3$$

Thus the auxiliary current transformer 18 develops a current substantially expressed by $a \cdot I_2$. It is noted that a is larger than 1, because $N_3$ is smaller than $N_2$ as described above.

There are provided output terminals 23 and 24 for connection to a load impedance 25. Terminal 23 is also connected to terminal 21 of the auxiliary current transformer 18, and terminal 24 is connected to terminal 17 of the main current transformer 10. The terminals 16 and 22 of the main and auxiliary current transformers 10 and 18 are also connected. Connected between terminal 16 of the main current transformer 10 and output terminal 23 is a feedback impedance 26 which forms a series connection with load impedance 25 across secondary winding 15 of the main current transformer 10. Thus a current $I_2$ flows into this series connection from the secondary winding 15 through its terminal 16 while a current $I_3$ (i.e. $a \cdot I_2$) from the secondary winding 20 flows through the feedback impedance 26 in the opposite direction, resulting in a current $I_2 - a \cdot I_2$ flowing in the feedback impedance 26.

The feedback impedance 26 has an impedance $Z_F$ expressed by:

$$Z_F = (Z_2 + Z_L)/(a-1) \tag{1}$$

wherein, $Z_2$ denotes the secondary leakage impedance, including resistance, reactance and stray capacitance of the secondary winding 15 of the main current transformer 10; and $Z_L$ denotes the impedance of the load 25.

In explaining operation of the current-transforming apparatus shown in FIG. 1, consideration, at first will be given to the current transformer. An equivalent circuit for the main current transformer may, as well-known in the art, be shown as that in FIG. 2, wherein quantities are referred to the secondary.

Figure 2:
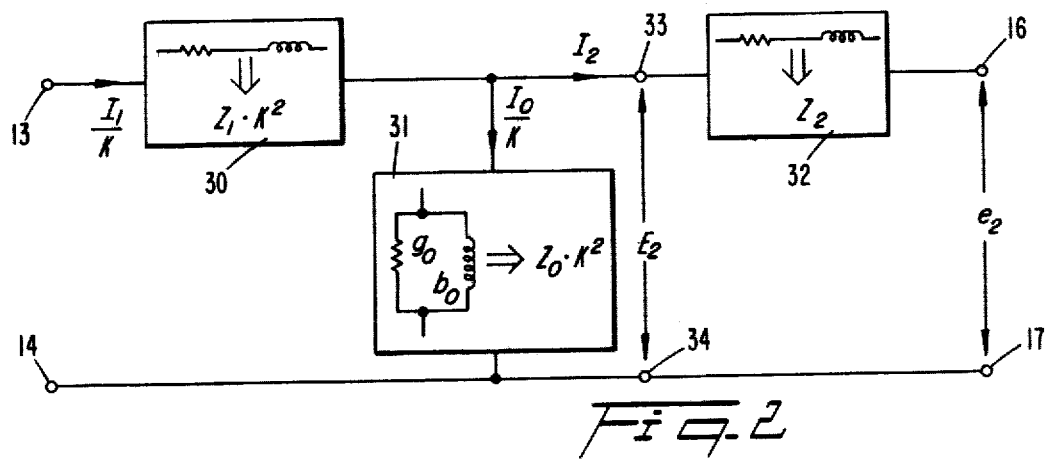
FIG. 2 shows an equivalent circuit of the current transformer for explaining operation of the embodiment shown in FIG. 1.

In FIG. 2, a primary current $I_1/K$ flowing into the transformer through terminal 13 flows in a primary leakage impedance 30 of $Z_1 \cdot K^2$, wherein K is $N_2/N_1$. The primary current $I_1/K$ is divided into an exciting current $I_o/K$ and the secondary current $I_2$. The exciting current $I_o/K$ flows through an exciting impedance 31 of $Z_o \cdot K^2$ to the terminal 14. The secondary current $I_2$ flows through the secondary leakage impedance 32 and a load (not shown) connected across terminals 16 and 17 to the terminal 14. Reference numerals 33 and 34 indicate points for consideration. It is noted that the word "secondary leakage impedance" is used to include resistance, reactance and also stray capacitance such as shown at element 32 in FIG. 2.

According to the equivalent circuit shown in FIG. 2, error depends on the difference between $I_1/K$ and $I_2$; this means that error is due to the exciting current $I_o/K$. The exciting current $I_o/K$ causes a secondary induced voltage $E_2$, across points 33 and 34, which may be expressed by:

$$E_2 = (Z_o \cdot K^2) \cdot (I_o)/K = Z_o \cdot I_o \cdot K \tag{2}$$

Figure 3:
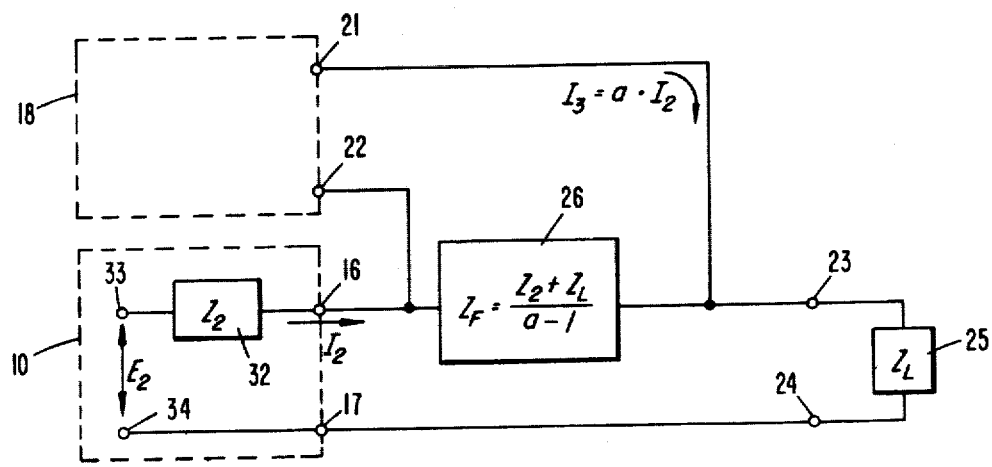
FIG. 3 shows an explanatory circuit diagram for explanation of the embodiment shown in FIG. 1.

Referring now to FIG. 3 which shows an explanatory diagram for the operation of the embodiment shown in FIG. 1, the main current transformer 10 is shown by a dotted black box having secondary leakage impedance 32, and the auxiliary current transformer 18 is shown by a dotted black box.

Consider now a loop along points 33–16–23–24–1–7–34, the secondary induced voltage $E_2$ can be calculated by:

$$E_2 = I_2 \cdot Z_2 + (I_2 - a \cdot I_2) \cdot Z_F + I_2 \cdot Z_L \tag{3}$$

considering the equation (1), then $$E_2 = I_2 \cdot + Z_2 \cdot (1 - a) \cdot \frac{Z_2 + Z_L}{a - 1} + I_2 \cdot Z_L$$
$$= 0$$

Thus, voltage due to the existence of the secondary leakage impedance 32 of $Z_2$ as well as load 25 of $Z_L$ is cancelled by the function of the feedback impedance 26 of $Z_F$ and the current flowing therethrough expressed by $I_2 - a \cdot I_2$. The secondary induced voltage $E_2$ is substantially nulled in the embodiment shown in FIG. 1.

According to equation (2), there exists a proportional relationship, i.e., $I_o \alpha E_2$, between voltage $E_2$ and exciting current $I_o$, the latter being the cause of error. Hence, the exciting current is substantially nulled since the Voltage $E_2$ is substantially nulled.

Thus, the error due to existence of the exciting current can be substantially compensated to be null or zero.

In the prior art devices discussed above, the terminal voltage $e_2$ appearing on terminals 16 and 17 became substantially null. This was attained by using the feedback impedance of $Z_{FO} = Z_L/(a-1)$ in the prior art device mentioned first, and by virtually short-circuiting terminals 16 and 17 in the prior art mentioned secondly. Hence the secondary induced voltage $E_2$ (i.e. $I_2 \cdot Z_2$) still existed due to secondary leakage impedance. Error remained to some extent, therefore, due to the exciting current, which is in proportional relationship with the secondary induced voltage. In other words, such error is due to neglect of the secondary leakage impedance, in the prior art devices as referred to already.

In the embodiment shown in FIG. 1, adverse effect due to the existence of the secondary leakage impedance is compensated whereby the secondary induced voltage $E_2$ becomes substantially null.

Thus, in accordance with our invention, the ratio error and phase angle error are not substantially introduced as a result of the adverse effect from the secondary leakage impedance of the current transformer. Current transforming apparatus with improved accuracy is therefore obtained.

Further, as for the secondary winding of the main current transformer, relatively thin conductive wire can be employed, because the leakage impedance which also includes resistance is prevented from adversely affecting the accuracy. Also relatively small sized magnetic cores can be employed for the main current transformer because the virtual load therefor is relatively small, due to the fact that the terminal voltage $e_2$ is near zero, even though a load impedance is used. Thus, the main current transformer can be designed to be compact.

Referring now to FIG. 4, there is shown one typical example of the circuit of FIG. 1 in which "a" is made equal to "2" ($a = N_2/N_3 = 2$). As is easily understood from the above, the feedback impedance 40 will be expressed by:

$$Z_F = Z_2 + Z_L \tag{4}$$

In this example, it is preferable that the feedback impedance 40 consist of separate two impedance elements, one being $Z_2$, the other $Z_L$. Then equation (4) will be easily satisfied by varying impedance 40b to be equal to the impedance of the load 25.

Referring to FIG. 5 showing another embodiment of this invention, a variable impedance element 41 is employed for the feedback impedance. This provides an advantage that satisfying equation (1) is easily obtained by adjusting the variable impedance 41.

Further, a variable resistor may be employed for the variable impedance element, if extremely high accuracy is not required. Since the resistive component comprises a considerably large portion of the secondary leakage impedance of the current transformer, this contributes to cost down and also miniaturization.

Referring to FIG. 6, there is shown one example of an electronic watt-hour metering device incorporating the embodiment, of FIG. 5, according to this invention.

A voltage detecting device 51 develops a signal responsive to the load voltage v. A current detecting device 52, to which the embodiment of FIG. 5 is applied, develops a signal responsive to the load current "i". These signals are introduced into a calculating device 53 and are multiplied with each other to form a third signal proportional to electric power. This third signal is converted to a frequency signal in pulse form by a pulse-converter device 54, and is fed through frequency divider 55, to a counter 56 to thereby develop the watt hour signal.

Error of the current detecting device 52 can be minimized by adjusting the variable impedance 41 to substantially satisfy the requirement given by the equation (1).

Further, it is possible to design the calculating device 53 such that input impedance $53_Z$ be made variable. It may be convenient to employ a fixed resistor for the feedback resistor and adjust instead the input impedance $53_Z$ to substantially satisfy the equation (1).

Figure 7:
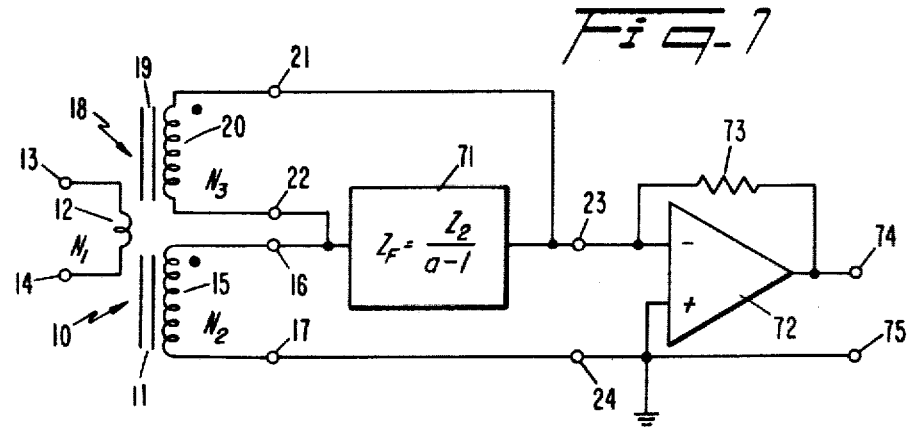
FIG. 7 is a circuit diagram of still another embodiment according to this invention.

Referring now to FIG. 7 which shows still another embodiment according to this invention, there is employed a current-voltage converter. The following description will be focused on the difference between this embodiment and that shown in FIG. 1.

A feedback impedance 71 has an impedance of $Z_F = Z_2/(a-1)$. There is provided an operational amplifier 72 having inverse and non-inverse input terminals and an output terminal. Connected between the inverse input and output terminals is a feedback resistor 73. The inverse input terminal is connected to the terminal 23. The non-inverse terminal is grounded and connected to the terminal 24. Numerals 74 and 75 indicate output terminals on which a voltage proportional to the input current to the operational amplifier 72 appears.

Figure 8:
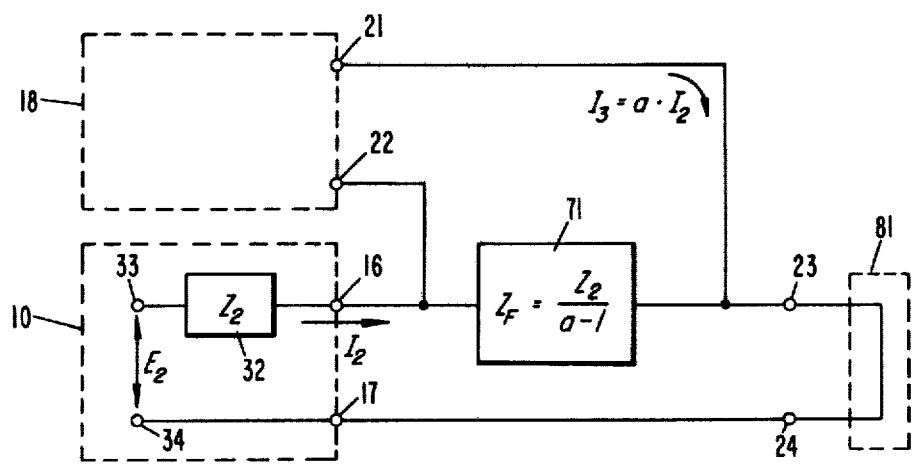
FIG. 8 is a circuit diagram for explanation of operation of the embodiment shown in FIG. 7.

In operation, the inverting input of the operational amplifier 72 appears, as is well known in the art, as virtual ground so that an explanatory figure corresponding to FIG. 3 will be shown as FIG. 8. As understood from this FIG. 8, the terminals 23 and 24 is virtually short circuited, as indicated at 81.

Thus, when considering the load impedance $Z_L$ being substantially zero, the equation (3) will be:

$$E_2 = I_2 \cdot Z_2 + (I_2 - a \cdot I_2) \cdot Z_F$$

Since the feedback impedance 71 comprises:

$$Z_F = Z_2/(a-1)$$

the induced voltage $E_2$ will be zero.

This means voltage due to the secondary leakage impedance $Z_2$ is cancelled by the compensating mutual effect between the feedback impedance and the current expressed by $I_2 - a \cdot I_2$. Thus, error due to the existence of the secondary leakage impedance can be substantially compensated, so that the current transforming circuit of relatively high accuracy can be obtained.

In this embodiment, the terminal voltage $e_2$ across the terminals 16 and 17 is also small. Then the main current transformer 10 may be designed relatively compact, as similar to the embodiment of FIG. 1.

Also, in this embodiment, the feedback impedance 71 which, in turn, is a load on the auxiliary current transformer 18 is relatively small compared to the embodiment of FIG. 1. The auxiliary current transformer 18 may therefore be designed to be compact. That is, there may be employed not only relatively thin conductive wire for the secondary winding 20 but also a relatively small magnetic core 19. It is noted that this is a considerable advantage when it is taken into account that the auxiliary current transformer is required to be of relatively large capacity due to the condition that "a" is made equal to 2, for example.

Figure 9:
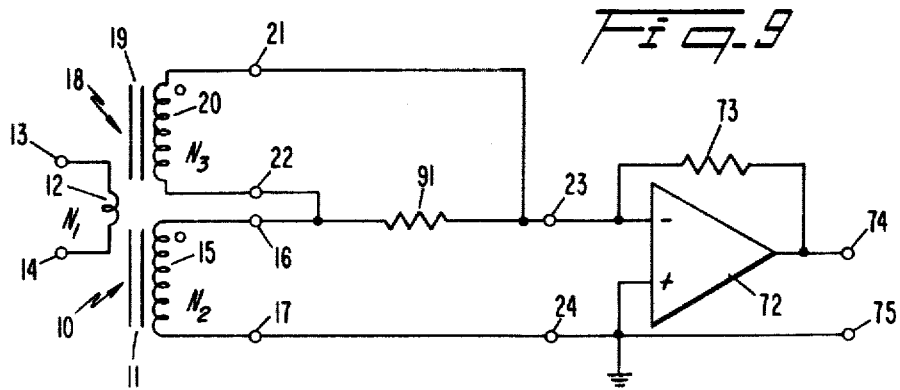
FIG. 9 is a circuit diagram of still another embodiment according to this invention.

As shown in FIG. 9, the feedback impedance 71 in the embodiment of FIG. 7 may be replaced by a fixed resistor 91, because a considerable component of the secondary leakage impedance $Z_2$ is resistive in nature, as set forth hereinbefore. A variable resistor may also be employed in place of fixed resistor 91.

Although the above description refers to particular embodiments, it should be understood that this invention will be carried out without departing from the spirit and nature of the invention within the scope of the appended claims wherein:

What is claimed is:

1. A current transforming circuit comprising:
   primary winding means;

a first secondary winding coupled magnetically to said primary winding means to form a first current transformer;

means for developing a current substantially equal to (a·$I_2$) wherein a is an arbitrary number greater than 1 and $I_2$ is the secondary current in said first secondary winding;

impedance means adapted to be connected to load means to form a series connection therewith across said first secondary winding, said impedance means having an impedance of approximately $(Z_2+Z_L)/(a-1)$ wherein $Z_2$ is the leakage impedance of said first secondary winding and $Z_L$ is the impedance of said load means; and said current developing means being connected to said impedance means such that a current substantially equal to ($I_2-a·I_2$) flows therethrough to substantially null voltages induced in the first secondary winding due to exciting currents present therein.

2. A current transforming circuit according to claim 1, wherein said current developing means comprises a second secondary winding coupled to said primary winding means to form a second current transformer.

3. A current transforming circuit according to claim 2, wherein said primary winding means comprises first and second primary windings connected in series and being magnetically coupled to said second and first secondary windings respectively.

4. A current transforming circuit according to claim 1, 2 or 3, wherein said impedance means is a resistor.

5. A current transforming apparatus according to claim 1, 2 or 3, wherein said impedance means is a variable resistor.

6. A current transforming circuit according to claim 1, 2 or 3, wherein the load means comprises a current-to-voltage converting means having substantially zero input impedance, said current-to-voltage converting means being connected to said impedance means to form a series connection therewith across said first secondary winding whereby $Z_L$ is substantially zero.

7. A current transforming circuit according to claim 4 wherein the load means comprises a current-to-voltage converting means having substantially zero input impedance, said current-to-voltage converting means being connected to said impedance means to form a series connection therewith across said first secondary winding whereby $Z_L$ is substantially zero.

8. A current transforming circuit according to claim 5 wherein the load means comprises a current-to-voltage converting means having substantially zero input impedance, said current-to-voltage converting means being connected to said impedance means to form a series connection therewith across said first secondary winding whereby $Z_L$ is substantially zero.

9. A current transforming circuit comprising:

primary winding means;

a first secondary winding coupled magnetically to said primary winding means to form a first current transformer;

impedance means;

current-to-voltage converting means having substantially zero input impedance, said current-to-voltage converting means being connected to said impedance means to form a series connection therewith across said first secondary winding for developing a voltage substantially proportional to the secondary current in the first secondary winding; and current developing means connected to apply a current to said impedance means, in cooperation with the secondary current in said first secondary winding, flowing such that the total current through said impedance means functions to substantially null the voltages induced in said first secondary winding due to the leakage impedance thereof.

10. A current transforming circuit according to claim 9, wherein said impedance means has an impedance approximately equal to $Z_2/(a-1)$, where $Z_2$ denotes said leakage impedance and a denotes a ratio of a current developed from said current developing means with respect to said secondary current in the first secondary winding.

11. A current transforming circuit according to claim 9 or 10, wherein said current developing means comprises a second secondary winding magnetically coupled to said primary winding means to form a second current transformer.

12. A current transforming circuit according to claim 11, wherein said primary winding means comprises first and second primary windings connected in series and being coupled magnetically to said second and first secondary winding respectively.

13. A current transforming circuit according to claim 9 or 10, wherein said impedance means is a variable resistor.

14. A current transforming circuit according to claim 11, wherein said impedance means is a resistor.

15. A current transforming circuit according to claim 12, wherein said impedance means is a resistor.

16. A current transforming circuit according to claim 9 or 10, wherein said impedance means is a resistor.

17. A current transforming circuit according to claim 11, wherein said impedance means is a variable resistor.

18. A current transforming circuit according to claim 12 wherein said impedance means is a variable resistor.

19. A current transforming circuit comprising:

a primary winding;

first and second secondary windings magnetically coupled to said primary winding to form, respectively first and second current transformers which develop a first secondary current $I_2$ and a second secondary current $I_3$, wherein $I_3$ is greater than $I_2$;

means having input impedance for measuring electrical quantity;

resistor means connected to said means to form a series connection across said first secondary winding, the resistor means having an impedance approximately equal to $(Z_2+Z_L)/(a-1)$, where $Z_2$ is the leakage impedance of said first secondary winding, $Z_L$ is said input impedance and a is $I_3/I_2$; and means for connecting said resistor means to said second secondary winding such that a current substantially equal to $I_2-I_3$ flows through said resistor means.

20. A current transforming circuit according to claim 19, wherein said resistor means comprises a variable resistor.

21. A current transforming circuit according to claim 19, wherein said resistor means comprises the series connection of a first resistor having an impedance value of $Z_2$ and a second resistor having an impedance value of $Z_L$, and a is equal to 2.

22. A current transforming circuit according to claim 19, wherein
said measuring means comprises a variable impedance.

* * * * *